US010790858B2

(12) United States Patent
Choi et al.

(10) Patent No.: US 10,790,858 B2
(45) Date of Patent: Sep. 29, 2020

(54) METHOD FOR TRANSMITTING/RECEIVING DATA BY UE AND UE THEREFOR

(71) Applicant: SAMSUNG ELECTRONICS CO., LTD., Suwon-si, Gyeonggi-do (KR)

(72) Inventors: Mun-hwan Choi, Seoul (KR); Hyeon-mok Ko, Hwaseong-si (KR); Kill-yeon Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/503,479

(22) PCT Filed: Aug. 11, 2015

(86) PCT No.: PCT/KR2015/008386
§ 371 (c)(1),
(2) Date: Feb. 13, 2017

(87) PCT Pub. No.: WO2016/024785
PCT Pub. Date: Feb. 18, 2016

(65) Prior Publication Data
US 2017/0230064 A1    Aug. 10, 2017

(30) Foreign Application Priority Data

Aug. 12, 2014  (KR) .................... 10-2014-0104535

(51) Int. Cl.
H03M 13/00    (2006.01)
H04L 1/18    (2006.01)
(Continued)

(52) U.S. Cl.
CPC .......... H03M 13/2906 (2013.01); H04L 1/00 (2013.01); H04L 1/0041 (2013.01);
(Continued)

(58) Field of Classification Search
CPC ............ H03M 13/2906; H03M 13/255; H04L 1/0041; H04L 1/0045; H04L 1/0042;
(Continued)

(56) References Cited

U.S. PATENT DOCUMENTS 6,324,667 B1 * 11/2001 Sugaya ................... H04L 1/004
714/746
8,065,586 B2 * 11/2011 Miyoshi ................. H04B 7/022
375/267
(Continued)

FOREIGN PATENT DOCUMENTS

CN    101682401    3/2010
CN    103503501    1/2014
(Continued)

OTHER PUBLICATIONS

International Search Report for PCT/KR2015/008386 dated Nov. 19, 2015, 4 pages.
(Continued)

Primary Examiner — Christine T. Tu
(74) Attorney, Agent, or Firm — Nixon & Vanderhye, P.C.

(57) ABSTRACT

Provided is a method of transmitting and receiving data by a user equipment (UE), the method including receiving, by the UE, a first data stream including at least one of transmission data and a first error correction code regarding the transmission data, obtaining a second error correction code based on the transmission data obtained from the received first data stream, and transmitting a second data stream including at least one of recovered transmission data and the obtained second error correction code.

13 Claims, 9 Drawing Sheets

(51) Int. Cl.
*H03M 13/29* (2006.01)
*H04W 28/04* (2009.01)
*H04L 1/00* (2006.01)

(52) U.S. Cl.
CPC .......... *H04L 1/0045* (2013.01); *H04L 1/0075* (2013.01); *H04W 28/04* (2013.01); *H04L 2001/0097* (2013.01)

(58) Field of Classification Search
CPC ... H04L 1/0057; H04L 1/0063; H04L 1/0061; H04L 1/00; H04L 1/0075; H04L 2001/0097; H04W 28/04
USPC ....... 714/755, 752, 746, 747, 750, 751, 758, 714/776; 370/248, 242, 252, 253, 435
See application file for complete search history.

(56) References Cited

U.S. PATENT DOCUMENTS

| | | | |
|---|---|---|---|
| 8,743,979 B2 | 6/2014 | Lee et al. | |
| 8,958,360 B2 | 2/2015 | Jang et al. | |
| 9,112,645 B2 | 8/2015 | Hassan et al. | |
| 9,699,740 B2 | 7/2017 | Bontu et al. | |
| 2004/0010742 A1* | 1/2004 | Williamson | H03M 13/1515 714/746 |
| 2007/0280368 A1 | 12/2007 | Jonsson | |
| 2008/0184087 A1* | 7/2008 | Hayashi | H04L 1/1812 714/751 |
| 2009/0036051 A1 | 2/2009 | Horiuchi et al. | |
| 2009/0083605 A1 | 3/2009 | Miyoshi et al. | |
| 2011/0087947 A1 | 4/2011 | Ono | |
| 2012/0159279 A1 | 6/2012 | Braithwaite | |
| 2012/0201192 A1 | 8/2012 | Hong et al. | |

FOREIGN PATENT DOCUMENTS

| | | |
|---|---|---|
| KR | 10-0792153 | 12/2007 |
| WO | WO 2011/096764 | 8/2011 |
| WO | WO 2012/008666 | 1/2012 |
| WO | 2012/109725 | 8/2012 |
| WO | 2014/014165 | 1/2014 |

OTHER PUBLICATIONS

Search Report and Written Opinion dated Nov. 19, 2015 in counterpart International Patent Application No. PCT/KR2015/008386 and English-language translation of same.
Extended European Search Report dated Feb. 19, 2018 in counterpart European Patent Application No. 15831884.0.
Office Action dated Jun. 24, 2019 in counterpart Chinese Patent Application No. 201580043305.3 and English-language translation.
Notice of Non-Final Rejection dated Jul. 27, 2020 in counterpart Korean Patent Application No. 10-2014-0104535 and English-language translation.

* cited by examiner

METHOD FOR TRANSMITTING/RECEIVING DATA BY UE AND UE THEREFOR

This application is the U.S. national phase of International Application No. PCT/KR2015/008386 filed Aug. 11, 2015 which designated the U.S. and claims priority to KR Patent Application No. 10-2014-0104535 filed Aug. 12, 2014, the entire contents of each of which are hereby incorporated by reference.

TECHNICAL FIELD

The present disclosure relates to a method of transmitting and receiving data by a user equipment (UE), a device for transmitting and receiving data, and a recording medium having recorded thereon a program for executing a method of transmitting and receiving data.

BACKGROUND ART

In a communication network environment, packets are delivered through a device such as a router, an access point, an evolved NodeB (eNB), etc., for communication between user equipments (UEs) incapable of performing direct communication therebetween.

In particular, due to constraints such as transmission power, etc., wireless communication has a limited distance where UEs communicate with each other. To overcome the limited distance, a wireless communication environment based on multi-hop communication has been considered in which a communication distance is extended in a manner for some UEs to deliver information received by the UEs to neighboring another UE.

In the wireless communication environment, a loss of a transmission packet may occur depending on a channel state between UEs. In a multi-hop environment where a communication is performed through several UEs, a loss occurs in a process where a UE transmits received information to another UE, such that various methods for recovering a transmission loss have been developed.

DETAILED DESCRIPTION OF THE INVENTION

Technical Problem

Due to constraints such as transmission power, etc., wireless communication has a limited distance where UEs communicate with each other. To overcome the limited distance, a wireless communication environment based on multi-hop communication has been considered in which a communication distance is extended in a manner for some UEs to deliver information received by the UEs to neighboring another UE.

Technical Solution

The present disclosure provides information allowing data recovery to recover lost data in a process where a UE transmits and receives data, thereby preventing a data loss from being expanded.

Advantageous Effects of the Invention

It is possible to prevent a data loss from being expanded.

BEST MODE

Figure 1:
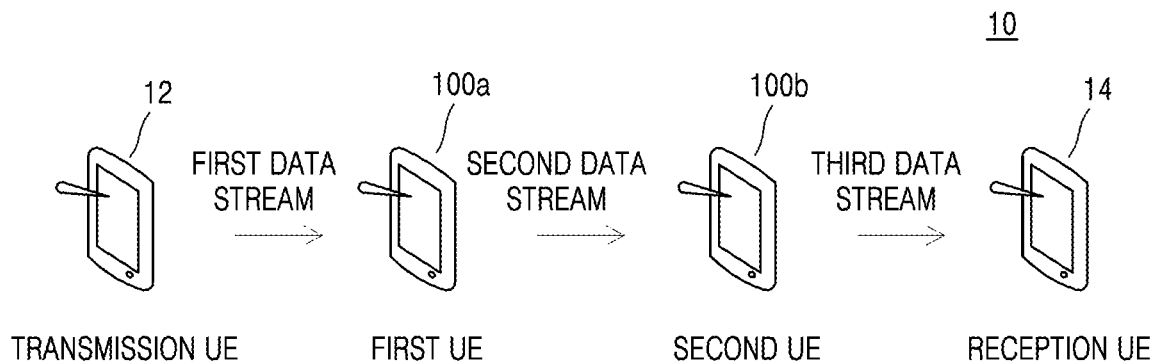
FIG. 1 is a conceptual view for describing a system in which a UE transmits and receives data according to an embodiment.

A method of transmitting and receiving data by a user equipment (UE) according to an embodiment includes receiving, by the UE, a first data stream including at least one of transmission data and a first error correction code regarding the transmission data, obtaining a second error correction code based on the transmission data obtained from the received first data stream, and transmitting a second data stream including at least one of recovered transmission data and the obtained second error correction code.

The method of transmitting and receiving data by the UE according to an embodiment may further include determining whether the transmission data is recoverable from the first data stream, in which the obtaining of the second error correction code includes obtaining the second error correction code based on the transmission data recovered from the first data stream, if the transmission data is recoverable.

The method of transmitting and receiving data by the UE according to an embodiment may further include predicting a transmission environment between the UE and an external UE that receives the second data stream transmitted by the UE and determining at least one of a number of data packets included in the second data stream and a number of second error correction packets included in the second data stream based on the predicted transmission environment.

In the method of transmitting and receiving data by the UE according to an embodiment, the predicting of the transmission environment may include determining at least one of the number of data packets included in the second data stream transmitted to the external UE from the UE and the number of second error correction packets included in the second data stream transmitted to the external UE from the UE.

The method of transmitting and receiving data by the UE according to an embodiment according to an embodiment may further include obtaining information about at least one data stream that is receivable by a UE next to the UE and determining at least one of the transmission data and the second error correction code included in the second data stream, based on the obtained information about the at least one data stream.

In the method of transmitting and receiving data by the UE, the obtaining of the second error correction code may include transmitting and receiving information about each error correction code to and from another UE and obtaining the second error correction code based on received information about an error correction code of the another UE.

In the method of transmitting and receiving data by the UE according to an embodiment, the obtaining of the second error correction code may include obtaining the second error correction code based on information about an error correction code included in the received first data stream.

In the method of transmitting and receiving data by the UE according to an embodiment, the second error correction code may be obtained based on information about an error correction code that is preset for each of a plurality of UEs.

In the method of transmitting and receiving data by the UE according to an embodiment, the second error correction code may be selected at random from among a plurality of error correction codes.

In the method of transmitting and receiving data by the UE according to an embodiment, the second data stream may include transmission data including at least one data packet and a second error correction code including at least one error correction packets.

The method of transmitting and receiving data by the UE according to an embodiment may further include determining a number of packets included in the second data stream and determining packets included in the second data stream from among the at least one data packet and the at least one error correction packet, based on the determined number of packets.

In the method of transmitting and receiving data by the UE according to an embodiment, the second data stream may include a plurality of second error correction packets.

The method of transmitting and receiving data by the UE according to an embodiment may further include determining a number of packets included in the second data stream and determining packets included in the second data stream from among the plurality of second error correction packets based on the determined number of packets.

A UE for transmitting and receiving data according to an embodiment includes a receiver configured to receive a first data stream including at least one of transmission data and a first error correction code regarding the transmission data, a controller configured to obtain a second error correction code based on the transmission data obtained from the received first data stream, and a transmitter configured to transmit a second data stream including at least one of recovered transmission data and the obtained second error correction code.

In the UE for transmitting and receiving the data according to an embodiment, the controller may be further configured to determine whether the transmission data is recoverable from the first data stream and obtain the second error correction code based on the transmission data recovered from the first data stream, if the transmission data is recoverable.

In the UE for transmitting and receiving the data according to an embodiment, the controller may be further configured to predict a transmission environment between the UE and an external UE that receives the second data stream transmitted by the UE and determine at least one of a number of data packets included in the second data stream and a number of second error correction packets included in the second data stream based on the predicted transmission environment.

In the UE for transmitting and receiving the data according to an embodiment, the controller may be further configured to determine at least one of the number of data packets included in the second data stream transmitted to the external UE from the UE and the number of second error correction packets included in the second data stream transmitted to the external UE from the UE.

In the UE for transmitting and receiving the data according to an embodiment, the receiver may be further configured to obtain information about at least one data stream that is receivable by a UE next to the UE and determine at least one of the transmission data and the second error correction code included in the second data stream based on the obtained information about the at least one data stream.

In the UE for transmitting and receiving the data according to an embodiment, the controller may be further configured to transmit and receive information about each error correction code to and from another UE and obtain the second error correction code based on received information about an error correction code of another UE, in which the error correction code of the UE and the error correction code of the another UE are different from each other.

In the UE for transmitting and receiving the data according to an embodiment, the controller may be further configured to obtain the second error correction code based on information about an error correction code included in the received first data stream.

In the UE for transmitting and receiving the data according to an embodiment, the second error correction code may be obtained based on information about an error correction code that is preset for each of a plurality of UEs.

In the UE for transmitting and receiving the data according to an embodiment, the second error correction code may be selected at random from among a plurality of error correction codes.

In the UE for transmitting and receiving the data according to an embodiment, the second data stream may include transmission data including at least one data packet and a second error correction code including at least one error correction packets.

In the UE for transmitting and receiving the data according to an embodiment, the controller may be further configured to determine a number of packets included in the second data stream and determine packets included in the second data stream from among the at least one data packet and the at least one error correction packet, based on the determined number of packets.

In the UE for transmitting and receiving data according to an embodiment, the second data stream may include a plurality of second error correction packets.

In the UE for transmitting and receiving the data according to an embodiment, the controller may be further configured to determine a number of packets included in the second data stream and determine packets included in the second data stream from among the plurality of second error correction packets, based on the determined number of packets.

MODE OF THE INVENTION

Terms used herein will be described in brief, and the present disclosure will be described in detail.

Although terms used in the present disclosure are selected with general terms popularly used at present under the consideration of functions in the present disclosure, the terms may vary according to the intention of those of ordinary skill in the art, judicial precedents, or introduction of new technology. In addition, in a specific case, the applicant voluntarily may select terms, and in this case, the meaning of the terms is disclosed in a corresponding description part of the disclosure. Thus, the terms used in the present disclosure should be defined not by the simple names of the terms but by the meaning of the terms and the contents throughout the present disclosure.

Throughout the entirety of the specification of the present disclosure, if it is assumed that a certain part includes a certain component, the term 'including' means that a corresponding component may further include other components unless a specific meaning opposed to the corresponding component is written. The term used in the embodiments such as "unit" or "module" indicates a unit for processing at least one function or operation, and may be implemented in hardware, software, or in a combination of hardware and software.

Hereinafter, embodiments of the present disclosure will be described in detail with reference to the attached drawings to allow those of ordinary skill in the art to easily carry out the embodiments. However, the present disclosure may be implemented in various forms, and are not limited to the embodiments described herein. To clearly describe the present disclosure, parts that are not associated with the description have been omitted from the drawings, and throughout the specification, identical reference numerals refer to identical parts.

FIG. 1 is a conceptual view for describing a system 10 in which a user equipment (UE) 100a or 100b (hereinafter, 100) transmits and receives data according to an embodiment.

Referring to FIG. 1, the system 10 for transmitting and receiving data may include a first UE 100a, a second UE 100b, a transmission UE 12, and a reception UE 14.

The system 10 for transmitting and receiving data, illustrated in FIG. 1, includes elements associated with the current embodiment. Thus, it would be understood by those of ordinary skill in the art that general-purpose elements other than the elements illustrated in FIG. 1 may also be included. For example, the system 10 for transmitting and receiving data, illustrated in FIG. 1, may further include at least one UE in addition to include the first UE 100a and the second UE 100b.

The UE 100 is a computing device capable of computing data and performing wired or wireless communication. The UE 100 transmits at least one multimedia data as transmission data to another UE that then transmits the transmission data received from the UE 100 to still another UE. For example, a first UE 100a may transmit at least one multimedia data as transmission data to a second UE 100b that may then transmit the transmission data received from the first UE 100a to a third UE (not shown) or the reception UE 14.

Referring to FIG. 1, the transmission UE 12 and the reception UE 14 perform the same function as the UE 100. For convenience, the transmission UE 12 will be described as a UE that first obtains the transmission data without passing through another UE, and the reception UE 14 will be described as a UE that receives the transmission data and finally executes the transmission data.

The UE 100 transmits at least one of transmission data and an error correction code regarding the transmission data to another UE. For example, the first UE 100a may transmit at least one of transmission data and an error correction code regarding the transmission data to the second UE 100b. Herein, the error correction code may be obtained according to any conventional error correction algorithm used to recover transmission data. For example, the error correction code may be obtained by forward error correction (FEC).

A data transmission process and a data reception process performed by the UE 100 may be performed according to a real time protocol (RTP). However, this is only an embodiment and the present disclosure is not limited to the embodiment. Meanwhile, not shown, there may be intermediate nodes that relay data transmission between the first UE 100a and the second UE 100b.

A data transmission path between the first UE 100a and the second UE 100b may be entirely or partially wireless. Thus, at least one of the first UE 100a and the second UE 100b may be a wireless communication device. For example, the first UE 100a and the second UE 100b may be a mobile device such as a cellular phone, a personal digital assistant (PDA), a laptop computer, etc., but the present disclosure is not limited to this example.

Figure 2:
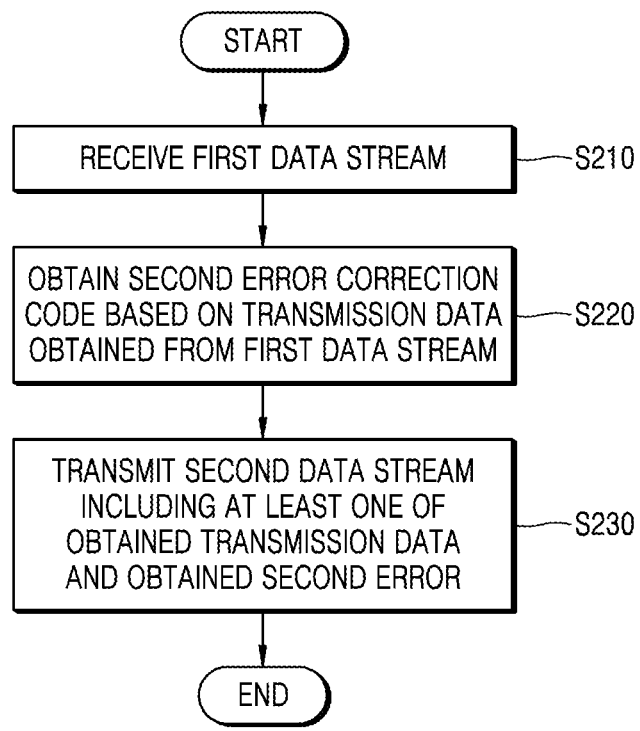
FIG. 2 is a flowchart illustrating a method in which a UE transmits and receives data, according to an embodiment.

FIG. 2 is a flowchart illustrating a method in which the UE 100 transmits and receives data, according to an embodiment.

In operation 210, the UE 100 receives a first data stream including at least one of transmission data and a first error correction code regarding the transmission data. When the first data stream is transmitted to the UE 100, transmission data included in the first data stream may be partially or completely lost. If the transmission data is partially or completely lost, the UE 100 may recover the transmission data by using the first error correction code. Herein, various methods such as FEC may be used to recover lost data.

When FEC is applied in an application layer, the UE 100 recovers transmission data in the unit of a packet. If some of a plurality of data packets included in transmission data are lost, the UE 100 recovers the lost data packets by using error correction packets obtained using FEC. For example, the UE 100 may receive a plurality of data packets A, B, and C, together with a plurality of error correction packets D and E, from the transmission UE 12. Herein, as the number of error correction packets received together with a plurality of data packets by the UE increases, a probability of recovering lost data packets from the first data stream received by the UE 100 increases.

In operation 220, the UE 100 obtains a second error correction code based on the transmission data obtained from the received first data stream. Herein, the UE 100 obtains the second error correction code by using the same algorithm as that used to obtain the first error correction code. For example, if the first error correction code is obtained by FEC based on a hamming code, the UE 100 obtains the second error correction code by applying hamming code-based FEC to the transmission data.

The UE 100 obtains the second error correction code, which is different from the first error correction code, based on the transmission data obtained from the first data stream.

To obtain an error correction code that is different from those of other UEs existing in the system 10, the UE 100 exchanges information about a desired error correction code with those other UEs.

For example, the UE 100 may be prevented from obtaining the same error correction code as that obtained by another UE existing in the system 10 by obtaining information about the error correction code obtained by the another UE. The UE 100 transmits the obtained information about the error correction code to other UEs existing in the system 10. However, this is only an embodiment and the present disclosure is not limited to the embodiment.

According to another embodiment, there may be an error correction code that is preset for each UE existing in the system 10. Error correction codes that are preset for UEs, respectively, may be different from each other.

According to another embodiment, when the transmission UE 12 sets different error correction codes for UEs included in the system 10 and transmits a data stream, the transmission UE 12 may transmit information about an error correction code that is set for each UE.

According to another embodiment, UEs included in the system 10 may select an error correction code at random according to a preset random process. Herein, UEs included in the system 10 may also include the transmission UE 12 and the reception UE 14.

In operation 230, the UE 100 transmits a second data stream including at least one of obtained transmission data and an obtained second error correction code. The UE 100 transmits a second data stream including at least one of recovered transmission data and the obtained second error correction code to another UE.

Meanwhile, the second data stream may include data in the unit of a packet. The UE 100 obtains the second data stream by selecting at least one packet from among a plurality of data packets included in received transmission data and a plurality of error correction packets obtained based on the plurality of data packets. For example, the UE 100 may select packets A, B, F, and I from among data packets A, B, and C recovered from the received second data stream and a plurality of error correction packets F, G, and I, to obtain the second data stream. The UE 100 transmits the obtained second data stream to another UE.

Meanwhile, this is merely an embodiment, and the second data stream obtained by the UE 100 is not limited to the embodiment. The second data stream may include a second error correction code newly obtained from transmission data recovered by the UE 100.

Figure 3:
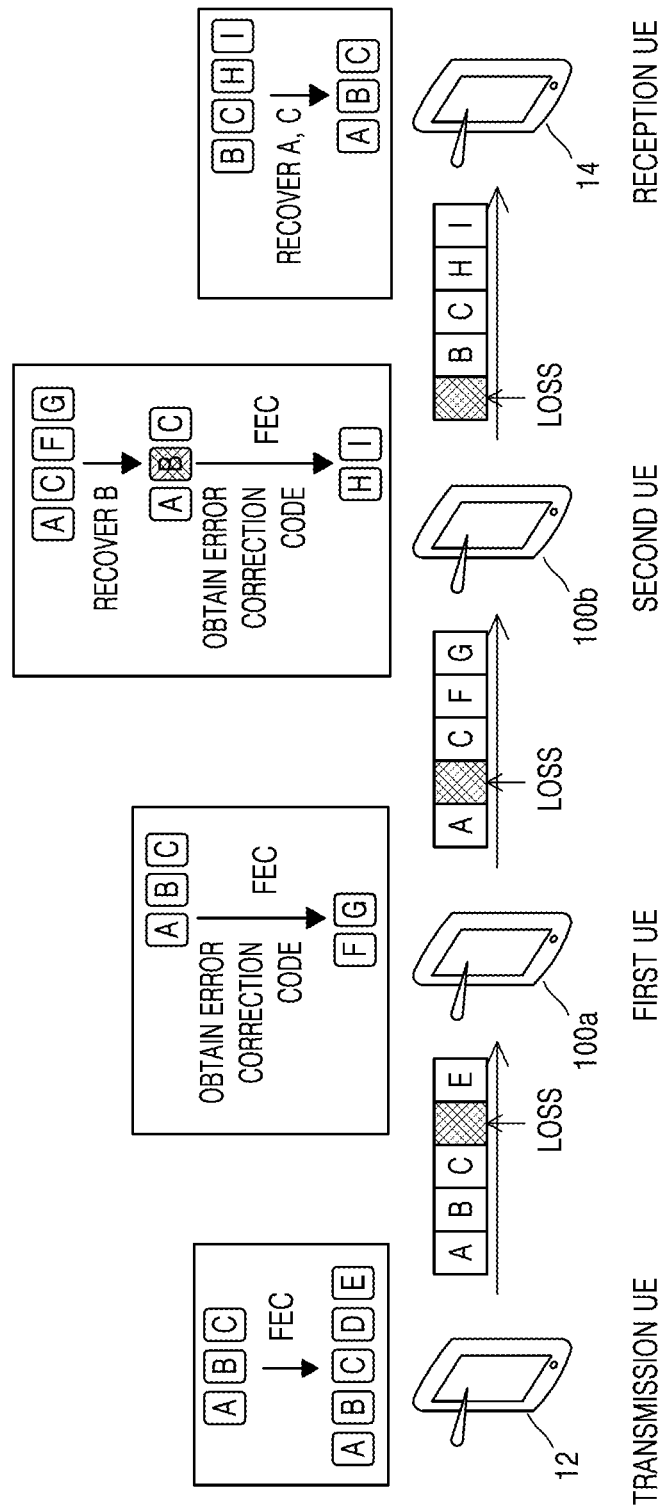
FIG. 3 is a flowchart illustrating a method in which a UE recovers data that is lost in a received data stream and transmits the recovered data to another UE, according to an embodiment.

FIG. 3 is a flowchart illustrating a method in which the UE 100 recovers data that is lost in a received data stream and transmits the recovered data to another UE, according to an embodiment. Referring to FIG. 3, the system 10 for transmitting and receiving data may include the first UE 100*a*, the second UE 100*b*, the transmission UE 12, and the reception UE 14. In FIG. 3, for convenience, transmission data or an error correction code transmitted and received will be described in the unit of a packet.

The transmission UE 12 obtains a plurality of error correction packets D and E based on a plurality of data packets A, B, and C. The transmission UE 12 obtains a first data stream including the plurality of data packets A, B, and C and the plurality of error correction packets D and E. The transmission UE 12 transmits the first data stream to the first UE 100*a*.

The first UE 100*a* according to an embodiment may receive the first data stream from the transmission UE 12. Depending on a channel state between the transmission UE 12 and the first UE 100*a*, packets included in the first data stream may be lost. Referring to FIG. 3, for example, if the plurality of data packets A, B, and C and the plurality of error correction packets D and E are included in the first data stream, the first UE 100*a* may receive the first data stream from which the error correction packet D is lost.

The first UE 100*a* obtains a plurality of second error correction packets F and G based on the plurality of data packets A, B, and C included in the received first data stream. Herein, the second error correction packets F and G may be obtained using the same algorithm as used for a first error correction packet. However, the first error correction packet and the second error correction packet may have different values.

The first UE 100*a* transmits a second data stream including the plurality of data packets A, B, and C and the plurality of second error correction packets F and G to the second UE 100*b*. Depending on a channel state between the first UE 100*a* and the second UE 100*b*, packets included in the second data stream may be lost. Referring to FIG. 3, for example, if the plurality of data packets A, B, and C and the plurality of second error correction packets F and G are included in the second data stream, the second UE 100*b* may receive the second data stream from which the data packet B is lost.

The second UE 100*b* recovers the lost data packet B based on the second error correction packets F and G included in the received second data stream. The second UE 100*b* may recover the plurality of data packets A, B, and C and the plurality of error correction packets F and G included in the second data stream, by recovering the received second data stream.

The second UE 100*b* according to an embodiment may obtain a plurality of third error correction packets H and I based on the plurality of data packets A, B, and C. Herein, the third error correction packets H and I may be obtained using the same algorithm as used for the first error correction packet and the second error correction packets. However, the third error correction packet may have a value that is different from that of the first error correction packet or the second error correction packet.

The second UE 100*b* transmits a third data stream including the plurality of data packets A, B, and C and the plurality of third error correction packets H and I to the reception UE 14. Depending on a channel state between the second UE 100*b* and the reception UE 14, packets included in the third data stream may be lost. Referring to FIG. 3, for example, if the plurality of data packets A, B, and C and the plurality of third error correction packets H and I are included in the third data stream, the reception UE 14 may receive the third data stream from which the data packet A is lost. The reception UE 14 recovers the lost data packet A based on the plurality of third error correction packets H and I included in the received third data stream.

The reception UE 14 may execute the received data packets by using a proper multimedia processor. However, this is only an embodiment and the present disclosure is not limited to the embodiment.

Figure 4:
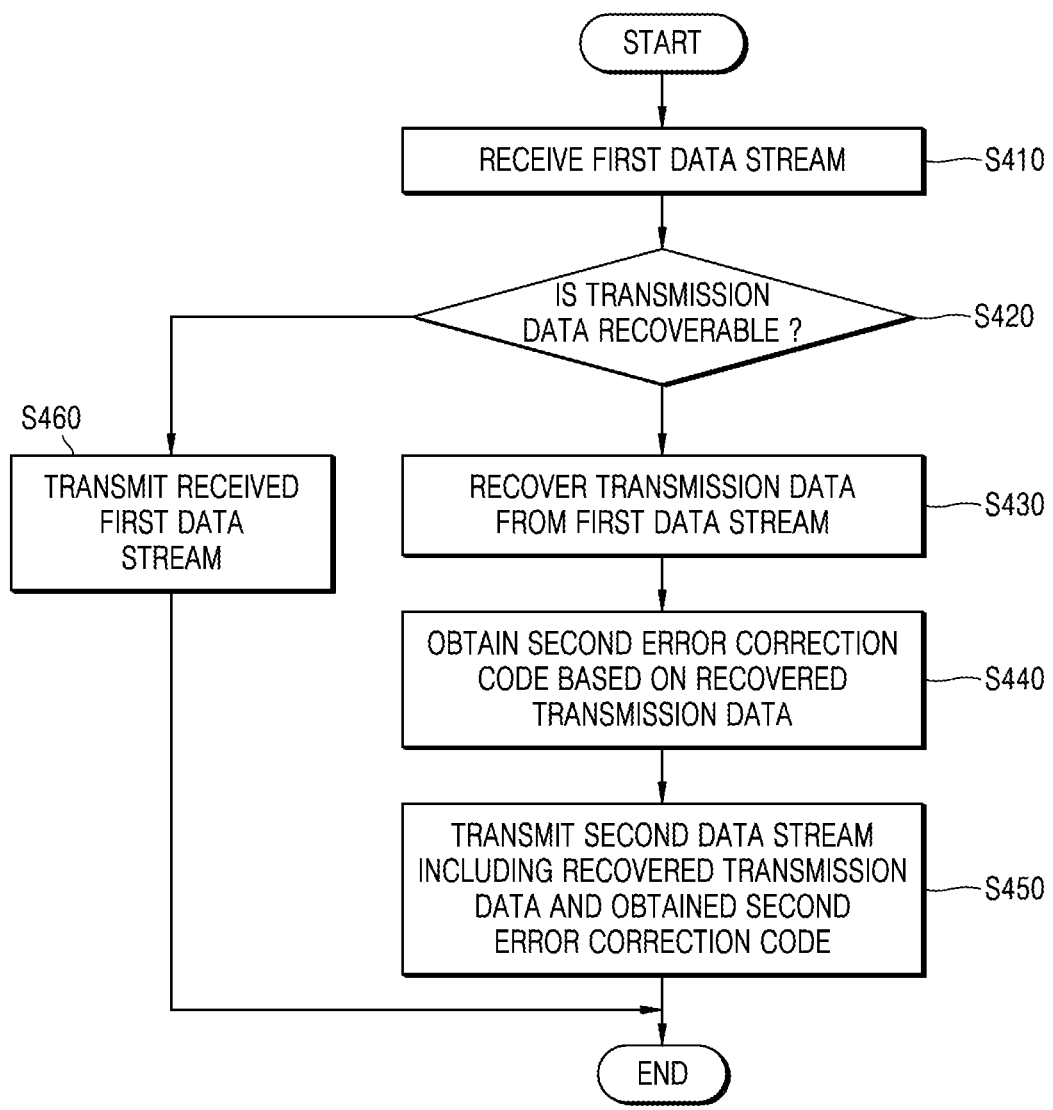
FIG. 4 is a flowchart illustrating a method in which a UE transmits a second data stream to another UE based on transmission data recovered from a received first data stream, according to an embodiment.

FIG. 4 is a flowchart illustrating a method in which the UE 100 transmits a second data stream to another UE based on transmission data recovered from a received first data stream, according to an embodiment.

In operation 410, the UE 100 receives a first data stream including at least one of transmission data and a first error correction code regarding the transmission data. By using the first error correction code, the UE 100 recovers data that is lost during transmission of the first data stream to the UE.

Operation 410 may correspond to operation 210 of FIG. 2.

In operation 420, the UE 100 determines whether transmission data is recoverable from the received first data stream. If the transmission data obtained from the first data stream is partially lost, the UE 100 according to an embodiment determines whether the lost transmission data is recoverable based on an error correction code. Determination of whether the UE 100 may recover the lost transmission data may be performed using an existing algorithm.

For example, the first data stream may include at least one of a plurality of data packets and a plurality of error correction packets. As the number of packets included in the first data stream received by the UE 100 increases, a probability of recovering a lost data packet may increase.

In operation 430, the UE 100 recovers the transmission data from the first data stream. If the UE 100 determines that the lost transmission data is recoverable from the received first data stream, the UE may recover the lost transmission data based on non-lost transmission data or non-lost error correction code included in the first data stream.

In operation 440, the UE 100 obtains a second error correction code based on the recovered transmission data. The UE 100 obtains the second error correction code, which is different from the first error correction code, based on the transmission data recovered from the first data stream. Herein, the UE 100 obtains the second error correction code by using the same algorithm as that used to obtain the first error correction code.

Operation 440 may correspond to operation 220 of FIG. 2.

In operation 450, the UE 100 transmits a second data stream including at least one of the recovered transmission data and the obtained second error correction code.

The UE 100 transmits a second data stream including at least one of recovered transmission data and the obtained second error correction code to another UE.

Operation 450 may correspond to operation 230 of FIG. 2.

In operation 460, the UE 100 transmits the received first data stream to another UE. If the UE 100 determines that the transmission data may not be recovered from the received first data stream, the UE 100 delivers the received first data stream to another UE.

Figure 5:
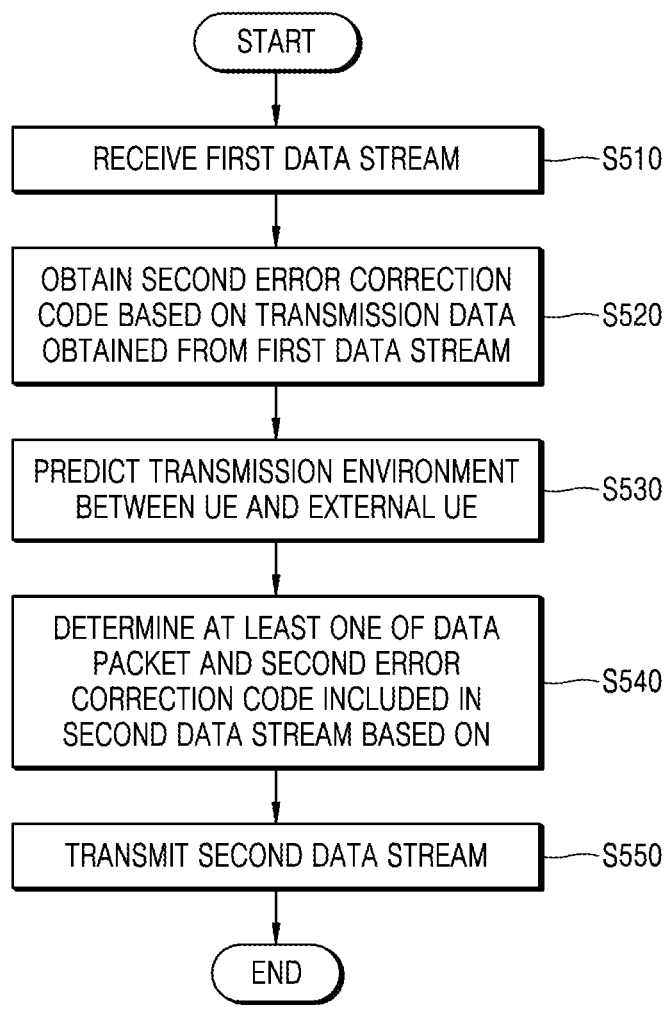
FIG. 5 is a flowchart illustrating a method in which a UE predicts a transmission environment of a channel and transmits a data stream, according to an embodiment.

FIG. 5 is a flowchart illustrating a method in which the UE 100 predicts a transmission environment of a channel and transmits a data stream, according to an embodiment.

In operation 510, the UE 100 receives a first data stream including at least one of transmission data and a first error correction code regarding the transmission data. By using the first error correction code, the UE 100 recovers data that is lost during transmission of the first data stream to the UE.

Operation 510 may correspond to operation 210 of FIG. 2.

In operation 520, the UE 100 obtains a second error correction code based on the transmission data obtained from the received first data stream. The UE 100 obtains the second error correction code, which is different from the first error correction code, based on the transmission data obtained from the first data stream. If the transmission data included in the received first data stream is lost, the UE 100 recovers the lost transmission data by using the first error correction code. If the transmission data included in the first data stream is not lost, the UE 100 obtains the transmission data by extracting the transmission data from the first data stream.

Operation 520 may correspond to operation 220 of FIG. 2.

In operation 530, the UE 100 predicts a transmission environment between the UE 100 and an external UE that receives the second data stream transmitted by the UE 100. The UE 100 according to an embodiment predicts the transmission environment between the UE 100 and the external UE based on a data loss rate of the second data stream transmitted to the external UE from the UE 100. Herein, the data loss rate may be a rate of lost data with respect to the entire data transmitted from the UE 100 to the external UE. For example, if data is transmitted and received in the unit of a packet between the UE 100 and the external UE, the data loss rate may be a rate of the number of lost data packets with respect to the number of all data packets transmitted from the UE 100 to the external UE.

In operation 540, the UE 100 determines at least one of the number of data packets included in the second data stream and the number of second error correction packets included in the second data stream, based on the predicted transmission environment. The UE 100 determines at least one of the number of data packets included in the second data stream and the number of second error correction packets included in the second data stream, based on the predicted transmission environment. For example, if a data loss rate of the second data stream transmitted from the UE 100 to the external UE is high, the UE 100 may determine a large number of data packets included in the second data stream and a large number of second error correction packets included in the second data stream.

In operation 550, the UE 100 transmits a second data stream including at least one of obtained transmission data and an obtained second error correction code. The UE 100 transmits a second data stream including at least one of recovered transmission data and the obtained second error correction code to another UE.

Operation 550 may correspond to operation 230 of FIG. 2.

Figure 6:
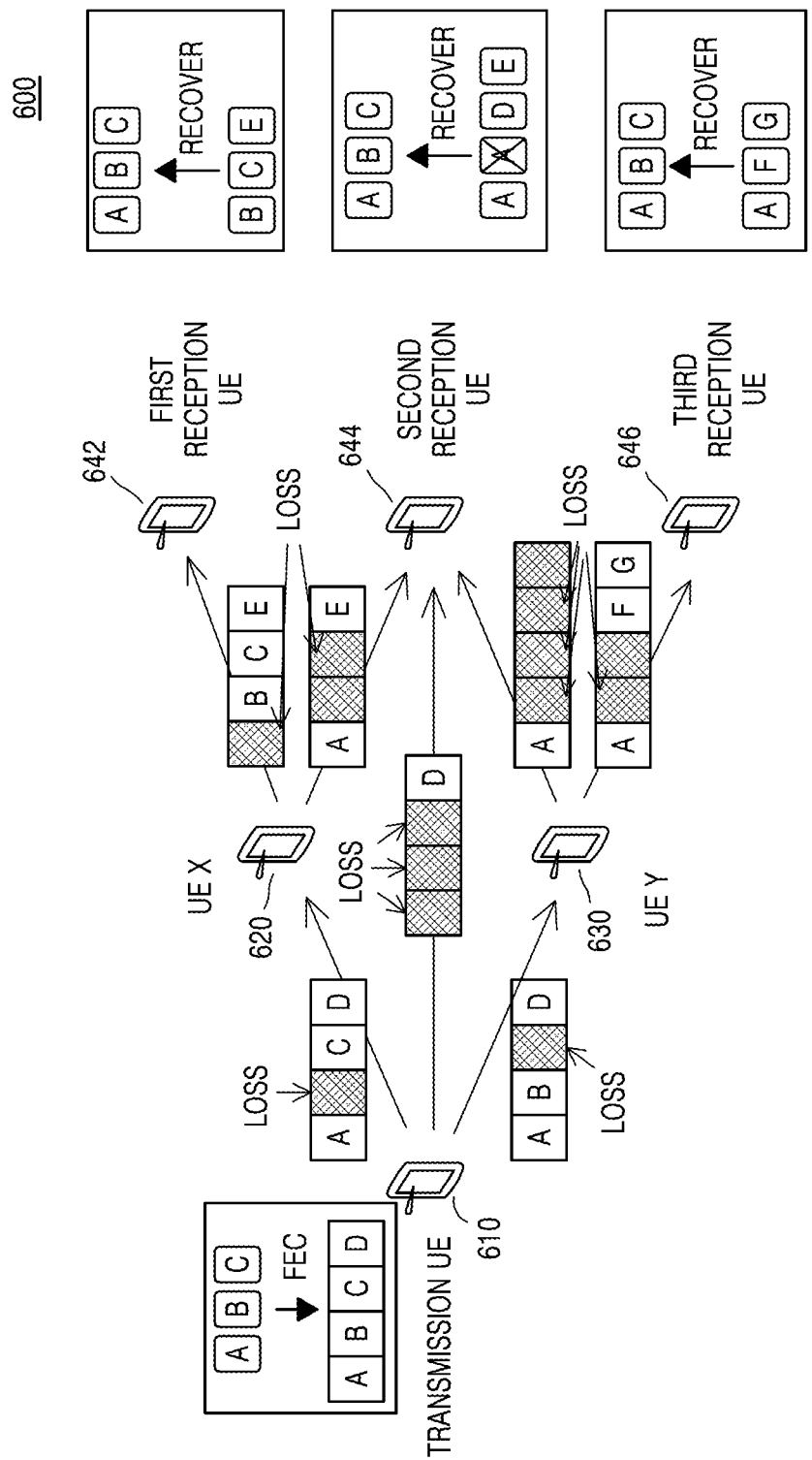
FIG. 6 is a diagram for describing a method in which a UE obtains a data stream for transmission to another UE, according to an embodiment.

FIG. 6 is a diagram for describing a method in which the UE 100 obtains a data stream for transmission to another UE, according to an embodiment. Referring to FIG. 6, a system 600 for transmitting and receiving data may include a transmission UE 610, a UE X 620, a UE Y 630, a first reception UE 642, a second reception UE 644, and a third reception UE 646. In FIG. 6, for convenience, transmission data or an error correction code transmitted and received will be described in the unit of a packet.

The transmission UE 610 obtains a first data stream including the plurality of data packets A, B, and C and the plurality of error correction packets D and E. Herein, the transmission UE 610 performs the same function as the transmission UE 12 of FIG. 1. The transmission UE 12 transmits the obtained first data stream to at least one another UE. Referring to FIG. 6, the transmission UE 12 transmits the obtained first data stream to the UE X 620, the UE Y 630, and the second reception UE 644.

The UE X 620 according to an embodiment receives the first data stream from the transmission UE 610. Depending on a channel state between the transmission UE 610 and the UE X 620, packets included in the first data stream may be lost. Referring to FIG. 6, for example, if the plurality of data packets A, B, and C and a first error correction packet D are included in the first data stream, the UE X 620 may receive the first data stream from which the data packet B is lost.

The UE X 620 recovers the lost data packet B based on the plurality of data packets A and C and the first error correction packet D included in the received first data stream. The UE X 620 obtains a second error correction packet E based on the recovered data packets. Herein, the second error correction packet E may be obtained using the same algorithm as used for a first error correction packet. However, the first error correction packet and the second error correction packet may have different values.

The UE X 620 transmits a second data stream including the plurality of data packets A, B, and C and the second error correction packet E to one or more reception UEs 642 and 644.

The UE Y 630 receives the first data stream from the transmission UE 610. Depending on a channel state between the transmission UE 610 and the UE y 630, packets included in the first data stream may be lost. Referring to FIG. 6, for example, if the plurality of data packets A, B, and C and the first error correction packet D are included in the first data stream, the UE Y 630 may receive the first data stream from which the data packet C is lost.

The UE Y 630 recovers the lost data packet C based on the plurality of data packets A and B and the first error correction packet D included in the received first data stream. The UE Y 620 obtains second error correction packets F and G based on the recovered data packets. Herein, the second error correction packets F and G may be obtained using the same algorithm as used for a first error correction packet. However, the first error correction packet and the second error correction packet may have different values.

The UE Y 630 transmits a third data stream including the plurality of data packets A, B, and C and the second error correction packets F and G to one or more reception UEs 644 and 646.

The first reception UE 642 receives the second data stream from the UE X 620. The first reception UE 642 recovers the lost data packet A based on the plurality of data packets B, C, and E included in the received second data stream.

The second reception UE 644 receives the second data stream from the UE X 620 and receives the first data stream from the transmission UE 610. The second reception UE 644 may also receive a third data stream from the UE Y. That is, the second reception UE 644 receives a plurality of data streams including different error correction packets.

The second reception UE 644 recovers the lost data packets based on data packets and error correction packets included in the plurality of data streams (the first data stream, the second data stream, and the third data stream). For example, the second reception UE 644 may recover the lost data packet based on the data packet A and the error correction packets D and E included in the plurality of data streams.

The third reception UE 646 receives the third data stream from the UE Y 620. The third reception UE 646 recovers the data packets B and C based on the plurality of data packets A, F, and G included in the received third data stream.

Figure 7:
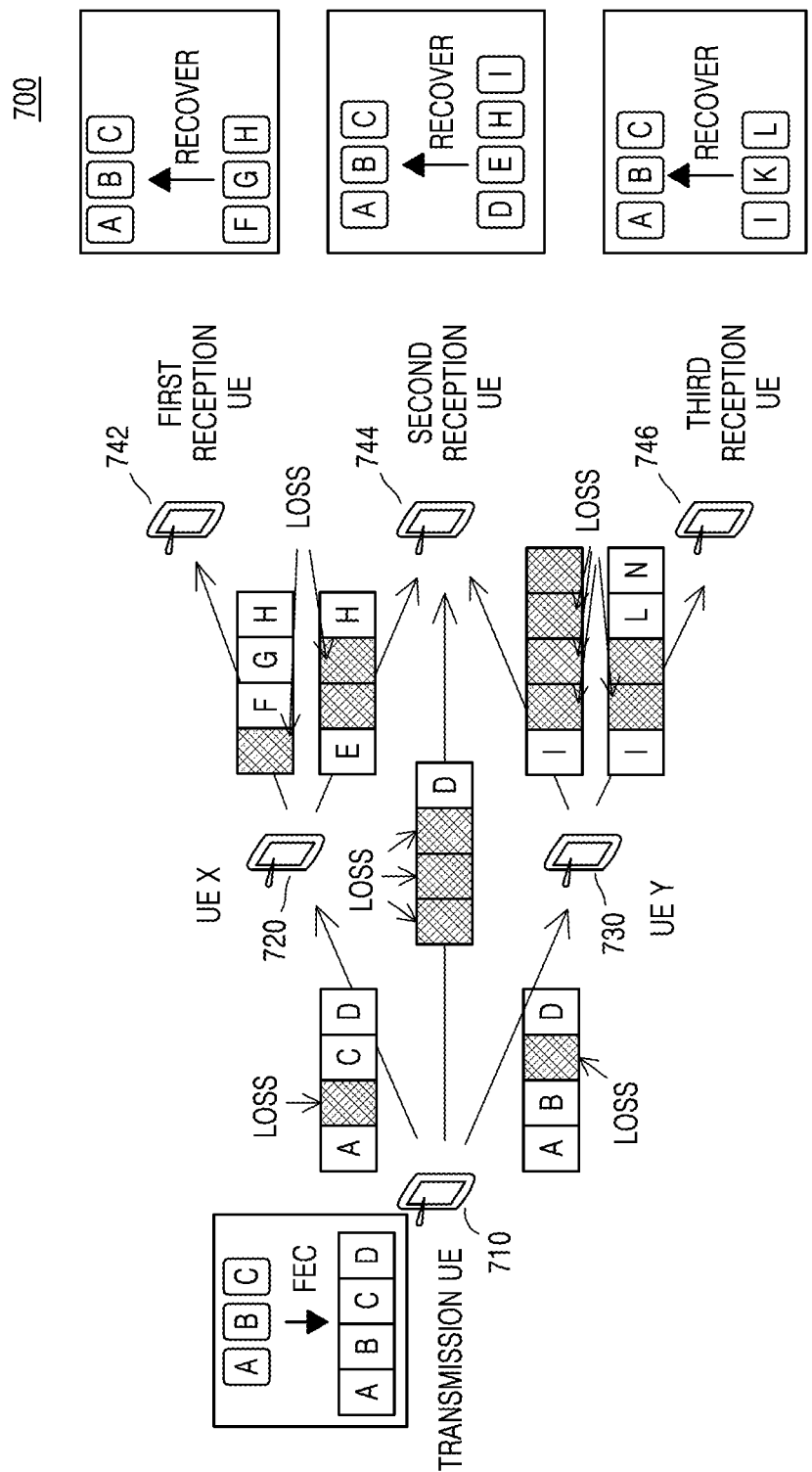
FIG. 7 is a diagram for describing a method in which a UE obtains a data stream for transmission to another UE, according to another embodiment.

FIG. 7 is a diagram for describing a method in which the UE 100 obtains a data stream for transmission to another UE, according to an embodiment. Referring to FIG. 7, a system 700 for transmitting and receiving data may include a transmission UE 710, a UE X 720, a UE Y 730, a first reception UE 742, a second reception UE 744, and a third reception UE 746. In FIG. 7, for convenience, transmission data or an error correction code transmitted and received will be described in the unit of a packet.

The transmission UE 710 obtains a first data stream including the plurality of data packets A, B, and C and the error correction packet D. Herein, the transmission UE 710 performs the same function as the transmission UE 12 of FIG. 1. The transmission UE 710 transmits the obtained first data stream to at least one another UE. Referring to FIG. 7, the transmission UE 710 transmits the obtained first data stream to the UE X 720, the UE Y 730, and the second reception UE 744.

The UE X 720 according to an embodiment receives the first data stream from the transmission UE 710. Depending on a channel state between the transmission UE 710 and the UE X 720, packets included in the first data stream may be lost. Referring to FIG. 7, for example, if the plurality of data packets A, B, and C and the first error correction packet D are included in the first data stream, the UE X 620 may receive the first data stream from which the data packet B is lost.

The UE X 720 recovers the lost data packet B based on the plurality of data packets A and C and the first error correction packet D included in the received first data stream. The UE X 620 obtains second error correction packets E, F, G, and H based on the recovered data packets. Herein, the second error correction packets E, F, G, and H may be obtained using the same algorithm as used for the first error correction packet. However, the first error correction packet and the second error correction packet may have different values.

The UE X 720 transmits a second data stream including the second error correction packets E, F, G, and H to one or more reception UEs 742 and 744.

The UE Y 730 receives the first data stream from the transmission UE 710. Depending on a channel state between the transmission UE 710 and the UE y 730, packets included in the first data stream may be lost. Referring to FIG. 7, for example, if the plurality of data packets A, B, and C and the second error correction packet D are included in the first data stream, the UE Y 730 may receive the first data stream from which the data packet C is lost.

The UE Y 730 recovers the lost data packet C based on the plurality of data packets A and B and the first error correction packet D included in the received first data stream. The UE Y 720 obtains third error correction packets I, J, K, L, and N based on the recovered data packets. Herein, the third error correction packets I, J, K, L, and N may be obtained using the same algorithm as used for the first error correction packet. However, the first error correction packet and the third error correction packet may have different values.

The UE Y 730 transmits a third data stream including a plurality of third error correction packets I, J, K, L, and N to at least one reception UEs 744 and 746.

The first reception UE 742 receives the second data stream from the UE X 720. The first reception UE 742 recovers the data packets A, B, and C based on the plurality of data packets F, G, and H included in the received second data stream.

The second reception UE 744 receives the second data stream from the UE X 720 and receives the first data stream from the transmission UE 710. The second reception UE 744 may also receive a third data stream from the UE Y 730. The second reception UE 744 receives a plurality of data streams including different error correction packets.

The second reception UE 744 recovers the lost data packets based on data packets and error correction packets included in the plurality of data streams (the first data stream, the second data stream, and the third data stream). For example, the second reception UE 744 may recover the lost data packet based on the error correction packets D, E, H, and I included in the plurality of data streams.

The third reception UE 746 receives the third data stream from the UE Y 720. The third reception UE 746 recovers the data packets A, B, and C based on third error correction packets I, L, and N included in the received third data stream.

Figure 8:
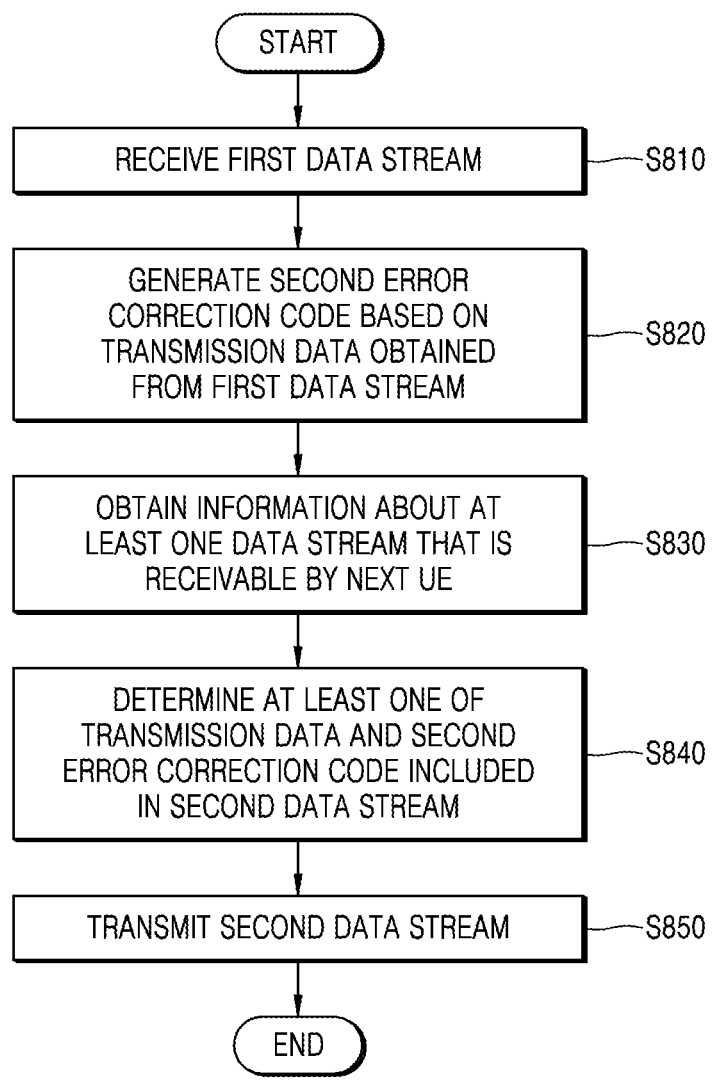
FIG. 8 is a flowchart illustrating a method in which a UE obtains an error correction code of the UE based on information about an error correction code of another UE, according to an embodiment.

FIG. 8 is a flowchart illustrating a method in which the UE 100 obtains an error correction code of the UE 100 based on information about an error correction code of another UE, according to an embodiment.

In operation 810, the UE 100 receives a first data stream including at least one of transmission data and a first error correction code regarding the transmission data. By using the first error correction code, the UE 100 recovers data that is lost during transmission of the first data stream to the UE.

Operation 810 may correspond to operation 210 of FIG. 2.

In operation 820, the UE 100 obtains a second error correction code based on the transmission data obtained from the received first data stream. The UE 100 obtains the second error correction code, which is different from the first error correction code, based on the transmission data obtained from the first data stream. If the transmission data included in the received first data stream is lost, the UE 100 recovers the lost transmission data by using the first error correction code. If the transmission data included in the first data stream is not lost, the UE 100 obtains the transmission data by extracting the transmission data from the first data stream.

Operation 820 may correspond to operation 220 of FIG. 2.

In operation 830, the UE 100 obtains at least one data stream that is receivable by the next UE. Herein, the next UE may include a UE that receives the second data stream transmitted by the UE.

Referring to FIG. 7, a UE next to the UE X 720 may be the first reception UE 742 or the second reception UE 744. The second reception UE 744 receives a first data stream, a second data stream, and a third data stream from the transmission UE 710, the UE X 720, and the UE Y 730, respectively. Herein, the first data stream, the second data stream, and the third data stream received by the second reception UE 744 may be included in at least one data stream that is receivable by the next UE.

Meanwhile, information about the at least one data stream that is receivable by the next UE may include the number and type of data packets included in the at least one data stream, the number and type of error correction packets included in the at least one data stream, or the like.

In operation 840, the UE 100 determines at least one of transmission data and a second error correction code included in the second data stream, based on the obtained information about the at least one data stream. The UE 100 may avoid an error correction code that is receivable by the next UE from another UE or may control a length of an error correction code obtained by the UE 100.

In operation 850, the UE 100 transmits a second data stream including at least one of obtained transmission data and an obtained second error correction code. The UE 100 transmits a second data stream including at least one of recovered transmission data and the obtained second error correction code to another UE.

Operation 850 may correspond to operation 230 of FIG. 2.

Figure 9:
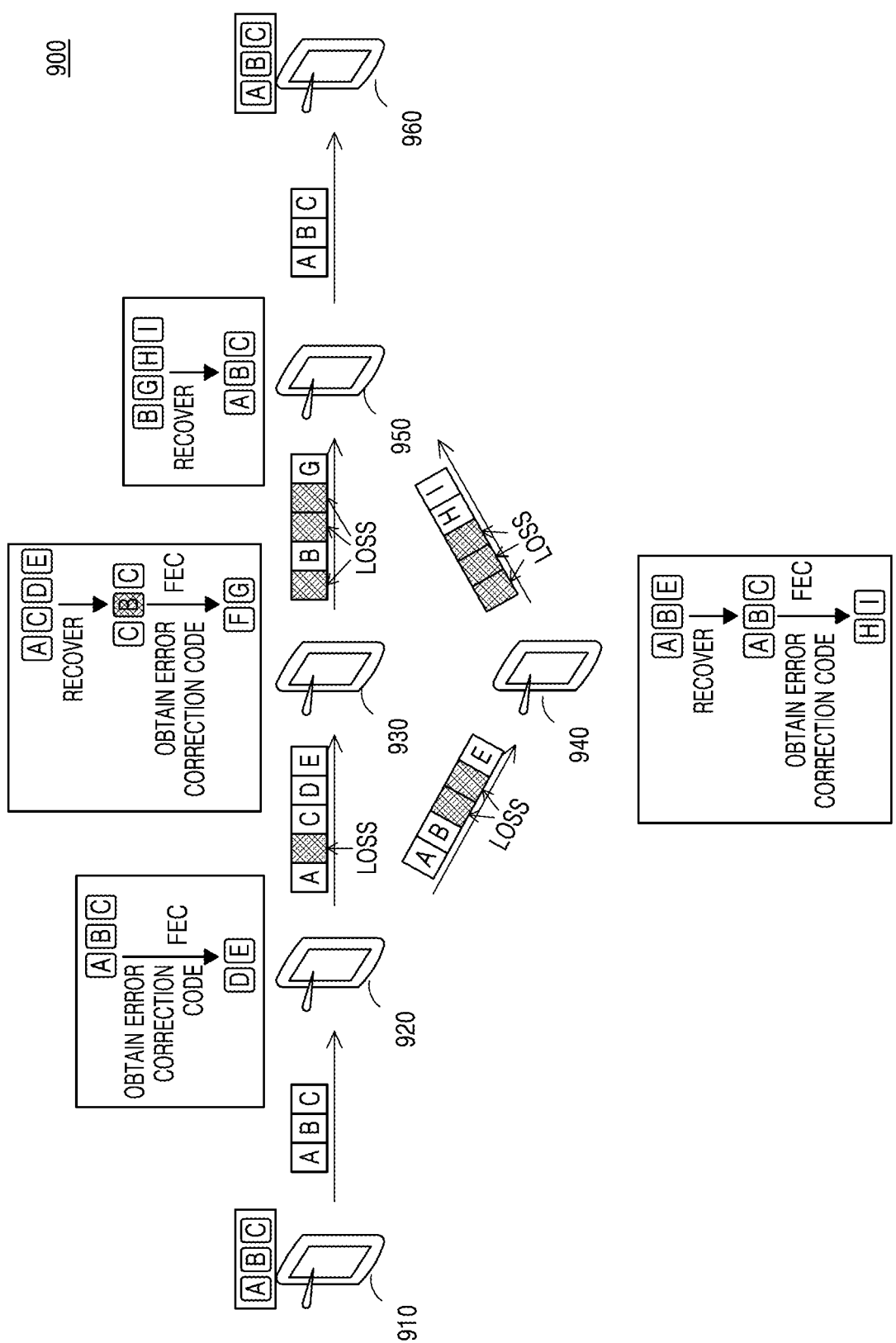
FIG. 9 is a diagram for describing a method in which a UE transmits and receives data, if a transmission UE and a reception UE do not perform an error correction function, according to an embodiment.

FIG. 9 is a diagram for describing a method in which the UE 100 transmits and receives data, if a transmission UE 910 and a reception UE 960 do not perform an error correction function, according to an embodiment.

Referring to FIG. 9, a system 900 for transmitting and receiving data may include a transmission UE 910, a first UE 920, a second UE 930, a third UE 940, a fourth UE 950, and a reception UE 960. In FIG. 9, for convenience, transmission data or an error correction code transmitted and received will be described in the unit of a packet.

The transmission UE 910 obtains a first data stream including the plurality of data packets A, B, and C. Herein, the transmission UE 910 may be a device incapable of performing an error correction function. The transmission UE 910 transmits the obtained first data stream to a first UE.

The first UE 920 according to an embodiment may receive the first data stream from the transmission UE 910. Referring to FIG. 9, the plurality of data packets A, B, and C are included, for example, in the first data stream. The first UE 920 obtains the plurality of error correction packets D and E based on the plurality of data packets A, B, and C. The first UE 920 obtains a second data stream including the plurality of data packets A, B, and C and the plurality of error correction packets D and E.

The first UE 920 transmits the second data stream to each of at least one next UE, i.e., each of the second UE 930 and the third UE 940.

Meanwhile, the second UE 930 receives the second data stream from the first UE 920. When the second data stream is transmitted to the second UE 930 from the first UE 920, transmission data included in the second data stream may be partially lost. For example, among the plurality of data packets A, B, and C included in the second data stream, the data packet B may be lost.

The second UE 930 recovers the lost data packet B based on an error correction packet included in the second data stream. Once recovery of the data packet is completed, the second UE 930 obtains new error correction packets F and G based on the recovered data packet. The second UE 930 transmits the second data stream including the plurality of recovered data packets A, B, and C and the newly obtained error correction packets F and G to the fourth UE 950.

Meanwhile, the third UE 940 receives the third data stream from the first UE 920. When the third data stream is transmitted to the third UE 940 from the first UE 920, transmission data included in the third data stream may be partially lost. For example, among the plurality of data packets A, B, and C included in the third data stream, the data packet C may be lost.

The third UE 940 recovers the lost data packet C based on an error correction packet included in the third data stream. Once recovery of the data packet is completed, the third UE 940 obtains new error correction packets H and I based on the recovered data packet. The third UE 940 transmits the third data stream including the plurality of recovered data packets A, B, and C and the newly obtained error correction packets H and I to the fourth UE 950.

The fourth UE 950 receives the second data stream from the second UE 930 and receives the third data stream from the third UE 940. When each of the second data stream and the third data stream is received in the fourth UE 950, a plurality of data packets included in each data stream may be partially or entirely lost. For example, among the plurality of data packets A, B, and C and the error correction packets F and G included in the second data stream, the data packets A and C and the error correction packet F may be lost. Among the plurality of data packets A, B, and C and the error correction packets H and I included in the third data stream, the data packets A, B, and C may be lost.

The fourth UE 950 recovers a data packet based on the data packet B and the error correction packets G, H, and I that are not lost in the second data stream and the third data stream.

Figure 10:
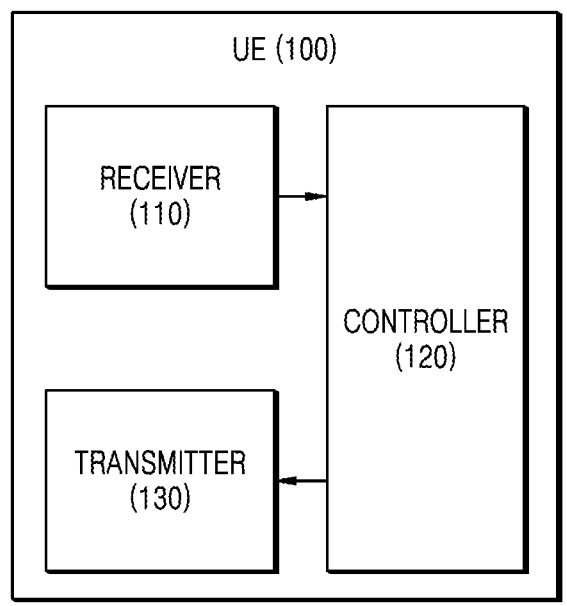
FIG. 10 is a block diagram of a UE that transmits and receives data according to an embodiment.

FIG. 10 is a block diagram of the UE 100 that transmits and receives data according to an embodiment.

Referring to FIG. 10, the UE 100 that transmits and receives data may include a receiver 110, a controller 120, and a transceiver 130. The UE 100 for transmitting and receiving data, illustrated in FIG. 10, includes elements associated with the current embodiment. Thus, it would be understood by those of ordinary skill in the art that general-purpose elements other than the elements illustrated in FIG. 10 may also be included.

The receiver 110 receives a first data stream including at least one of transmission data and a first error correction code regarding the transmission data. The receiver 110 receives information about an error correction code for each of a plurality of UEs included in the system 10.

The receiver 110 according to an embodiment obtains information about at least one data stream, which is receivable by the next UE that receives a second data stream, from the UE 100.

The controller 120 obtains a second error correction code based on the transmission data obtained from the received first data stream. The controller 120 obtains the transmission data by extracting the transmission data from the first data stream.

If the transmission data included in the first data stream is partially lost, the controller 120 determines whether the transmission data is recoverable from the first data stream. If the transmission data is recoverable, the controller 120 obtains a second error correction code based on the transmission data recovered from the first data stream.

The controller 120 may predict a transmission environment between the UE 100 and an external UE that receives the second data stream transmitted by the UE 100. The controller 120 determines at least one of the number of data packets included in the second data stream and the number of second error correction packets included in the second data stream, based on the predicted transmission environment. Herein, the transmission environment may be determined based on a data loss rate. For example, the UE 100 may determine at least one of the number of data packets included in the second data stream and the number of second error correction packets included in the second data stream, based on a data loss rate of the second data stream transmitted from the UE 100 to the external UE.

The controller 120 according to an embodiment determines at least one of transmission data and a second error correction code included in the second data stream, based on information about at least one data stream that is receivable by a UE next to the UE.

The controller 120 transmits and receives information about each error correction code to and from another UE and obtains the second error correction code based on the information about each error correction code received from another UE. Herein, the error correction code of the UE 100 and the error correction code of another UE may be different from each other.

The controller 120 obtains the second error correction code based on the information about the error correction code included in the received first data stream. According to another embodiment, the controller 120 may obtain an error correction code based on information about an error correction code that is preset for each of a plurality of UEs. According to another embodiment, the controller 120 may select an error correction code at random according to a preset random process.

The transmitter 130 transmits a second data stream including at least one of recovered transmission data and an obtained second error correction code. The transmitter 130 transmits information about an error correction code of the UE 100 to other UEs included in the system 10.

An apparatus according to the present disclosure may a processor, a memory for storing program data and executing it, a permanent storage such as a disk drive, a communications port for communicating with external devices, and user interface devices, such as a touch panel, a key, a button, etc. Methods implemented with a software module or algorithm may be stored as computer-readable codes or program instructions executable on the processor on computer-readable recording media. Examples of the computer-readable recording media may include a magnetic storage medium (e.g., read-only memory (ROM), random-access memory (RAM), floppy disk, hard disk, etc.) and an optical medium (e.g., a compact disc-ROM (CD-ROM), a digital versatile disc (DVD), etc.), and so forth. The computer-readable recording medium may be distributed over network coupled computer systems so that a computer-readable code is stored and executed in a distributed fashion. The medium may be read by a computer, stored in a memory, and executed by a processor.

All documents cited in the above description, including published documents, patent applications, and patents, may be incorporated herein in their entirety by reference in the same manner as when each cited document is separately and specifically incorporated or incorporated in its entirety.

Reference numerals have been used in exemplary embodiments illustrated in the attached drawings to help understanding of the present disclosure, and particular terms have been used to describe the embodiments of the present disclosure, but the present disclosure is not limited to the particular terms, and the present disclosure may include any element that may be generally conceived by those of ordinary skill in the art.

The present disclosure may be represented by block components and various process operations. Such functional blocks may be implemented by various numbers of hardware and/or software components which perform specific functions. For example, the present disclosure may employ various integrated circuit components, e.g., memory elements, processing elements, logic elements, look-up tables, and the like, which may carry out a variety of functions under the control of one or more microprocessors or other control devices. Similarly, where the elements of the present disclosure are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented as an algorithm executed in one or more processors. Furthermore, the present disclosure may employ any number of conventional techniques for electronics configuration, signal processing and/or control, data processing and the like. The term "mechanism", "element", "means", or "component" is used broadly and is not limited to mechanical or physical embodiments. The term may include a series of routines of software in conjunction with the processor or the like.

The particular implementations shown and described herein are illustrative examples of the present disclosure and are not intended to otherwise limit the scope of the present disclosure in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. Moreover, no item or component is essential to the practice of the present disclosure unless the element is specifically described as "essential" or "critical".

In the present disclosure (especially, in the claims), the use of "the" and other demonstratives similar thereto may correspond to both a singular form and a plural form. Also, if a range is described in the present disclosure, the range has to be regarded as including inventions adopting any individual element within the range (unless described otherwise), and it has to be regarded as having written in the detailed description of the disclosure each individual element included in the range. Unless the order of operations of a method according to the present disclosure is explicitly mentioned or described otherwise, the operations may be performed in a proper order. The order of the operations is not limited to the order the operations are mentioned. The use of all examples or exemplary terms (e.g., "etc.," "and (or) the like", and "and so forth") is merely intended to describe the present disclosure in detail, and the scope is not necessarily limited by the examples or exemplary terms unless defined by the claims. Also, one of ordinary skill in the art may appreciate that the present disclosure may be configured through various modifications, combinations, and changes according to design conditions and factors without departing from the spirit and technical scope of the present disclosure and its equivalents.

The invention claimed is:

1. A method of transmitting and receiving data by user equipment (UE) in a communication system, the method comprising:
   receiving from a first external UE, by the UE, a first data stream comprising first transmission data and a first error correction code regarding the first transmission data;
   receiving from a second external UE, by the UE, a second data stream comprising second transmission data and a second error correction code regarding the second transmission data,
   error-correcting, by the UE, the first transmission data from the received first data stream and the second transmission data from the received second data stream using the first error correction code and the second error correction code;
   generating, by the UE, a third error correction code based on the error-corrected first transmission data and the error-corrected second transmission data, the third error correction code being a code different from the first error correction code and the second error correction code;
   obtaining, by the UE, a third data stream by combining the error corrected first transmission data, the error-corrected second transmission data, and the third error correction code; and
   transmitting, by the UE, the third data stream.

2. The method of claim 1, further comprising:
   determining whether the first transmission data from the first data stream and the second transmission data from the second data stream is error-correctable,
   wherein the third error correction code is generated based on the error-corrected first transmission data and the error-corrected second transmission data, if the first transmission data and second transmission data is error-correctable.

3. The method of claim 1, further comprising:
   receiving, from a third external UE, error correction code information about an error correction code obtained at the third external UE, and
   wherein the generating of the third error correction code comprises generating the third error correction code based on the error-corrected first transmission data, the error-corrected second transmission data, and the error correction code information received from the third external UE.

4. The method of claim 1, wherein the third error correction code is generated based on information about the first error correction code included in the received first data stream and information about the second error correction code included in the received second data stream.

5. The method of claim 1, wherein each of the error-corrected first transmission data and error-corrected second transmission data comprises at least one data packet and the third error correction code comprises at least one error correction packet.

6. The method of claim 5, further comprising:
   determining a number of packets included in the third data stream; and
   determining packets included in the third data stream from among the at least one data packet and the at least one error correction packet, based on the determined number of packets.

7. User equipment (UE) for transmitting and receiving data in a communication system, the UE comprising:
   a receiver configured to receive from a first external UE a first data stream comprising first transmission data and a first error correction code regarding the first transmission data and to receive from a second external UE a second data stream comprising second transmission data and a second error correction code regarding the second transmission data;
   a controller configured to error-correct the first transmission data from the received first data stream and the second transmission data from the received second data stream using the first error correction code and the second error correction code, generate a third error correction code based on the error-corrected first transmission data and the error-corrected second transmission data, and obtain a third data stream by combining the error-corrected first transmission data, the error-corrected second transmission data and the third error correction code, the third error correction code being a code different from the first error correction code and the second error correction code; and
   a transmitter configured to transmit the third data stream.

8. The UE of claim 7, wherein the controller is further configured to determine whether the first transmission data from the first data stream and the second transmission data from the second data stream is error-correctable and generate the third error correction code based on the error-corrected first transmission data and the error-corrected second transmission data, if the first transmission data and the second transmission data is error-correctable.

9. The UE of claim 7, wherein the controller is further configured to receive, from a third external UE, error correction code information about an error correction obtained at the third external UE and generate the third error correction code based on the error-corrected first transmission data, the error-corrected second transmission data, and the error correction code information received from the third external UE.

10. The UE of claim 7, wherein the third error correction code is generated based on information about the first error correction code included in the received first data stream and information about the second error correction code included in the received second data stream.

11. The UE of claim 7, wherein each of the error-corrected first transmission data and the error-corrected second transmission data comprises at least one data packet and the third error correction code comprises at least one error correction packet.

12. The UE of claim 11, wherein the controller is further configured to determine a number of packets included in the third data stream and determine packets included in the third data stream from among the at least one data packet and the at least one error correction packet, based on the determined number of packets.

13. A non-transitory computer-readable recording medium having recorded thereon a program which, when executed by a computer of a user equipment (UE) in a communication system, causes the computer to execute:

receiving from a first external UE a first data stream comprising first transmission data and a first error correction code regarding the first transmission data;

receiving from a second external UE a second data stream comprising second transmission data and a second error correction code regarding the second transmission data;

error-correcting the first transmission data from the received first data stream and the second transmission data from the received second data stream using the first error correction code and the second error correction code;

generating a third error correction code based on the error-corrected first transmission data and the error-corrected second transmission data, the third error correction code being a code different from the first error correction code and the second error correction code;

obtaining a third data stream by combining the error corrected first transmission data, the error-corrected second transmission data, and the third error correction code; and transmitting the third data stream.

* * * * *